United States Patent
Wang et al.

(10) Patent No.: US 7,489,026 B2
(45) Date of Patent: Feb. 10, 2009

(54) METHODS AND APPARATUS FOR A QUAD FLAT NO-LEAD (QFN) PACKAGE

(75) Inventors: James J. Wang, Phoenix, AZ (US); William G. McDonald, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 15 days.

(21) Appl. No.: 11/590,327

(22) Filed: Oct. 31, 2006

(65) Prior Publication Data

US 2008/0099899 A1    May 1, 2008

(51) Int. Cl.
    *H01L 23/02* (2006.01)
(52) U.S. Cl. ........................ 257/678; 257/778
(58) Field of Classification Search .......... 257/777, 257/778, 723, 676, 698
    See application file for complete search history.

(56) References Cited

U.S. PATENT DOCUMENTS

| | | |
|---|---|---|
| 5,363,279 A | 11/1994 | Cha |
| 5,428,247 A | 6/1995 | Sohn et al. |
| 5,583,375 A | 12/1996 | Tsubosaki et al. |
| 5,648,680 A | 7/1997 | Ogawa et al. |
| 6,018,191 A | 1/2000 | Murakami et al. |
| 6,054,753 A | 4/2000 | Inaba |
| 6,075,284 A * | 6/2000 | Choi et al. ............ 257/676 |
| 6,225,558 B1 | 5/2001 | Hur |
| 6,427,976 B1 | 8/2002 | Huang et al. |
| 6,590,281 B2 | 7/2003 | Wu et al. |
| 6,962,829 B2 | 11/2005 | Glenn et al. |

* cited by examiner

*Primary Examiner*—Roy K Potter
(74) *Attorney, Agent, or Firm*—Ingrassia, Fisher & Lorenz, P.C.

(57) ABSTRACT

Methods and apparatus are provided for decreasing the size of Quad Flat No-Lead (QFN) packages (300, 400) down to chip-scale packages. Such QFN packages include a first semiconductor chip (310, 410), a plurality of recessed leads (306, 406, 408, 411) having mold lock features, and a mold material 340, 440 substantially encasing all sides of the semiconductor chip. An active surface (314, 414) of the semiconductor chip is oriented toward a mounting side (307, 407) of the QFN package, and a plurality of wire bonds 330, 430 disposed between the active surface and the mounting side couple the active side to the leads. The QFN packages may also include a second semiconductor chip (452) coupled to a plurality of leads (408) and to the first semiconductor chip via wire bonds (431, 432) in a manner similar to the first semiconductor chip.

23 Claims, 5 Drawing Sheets

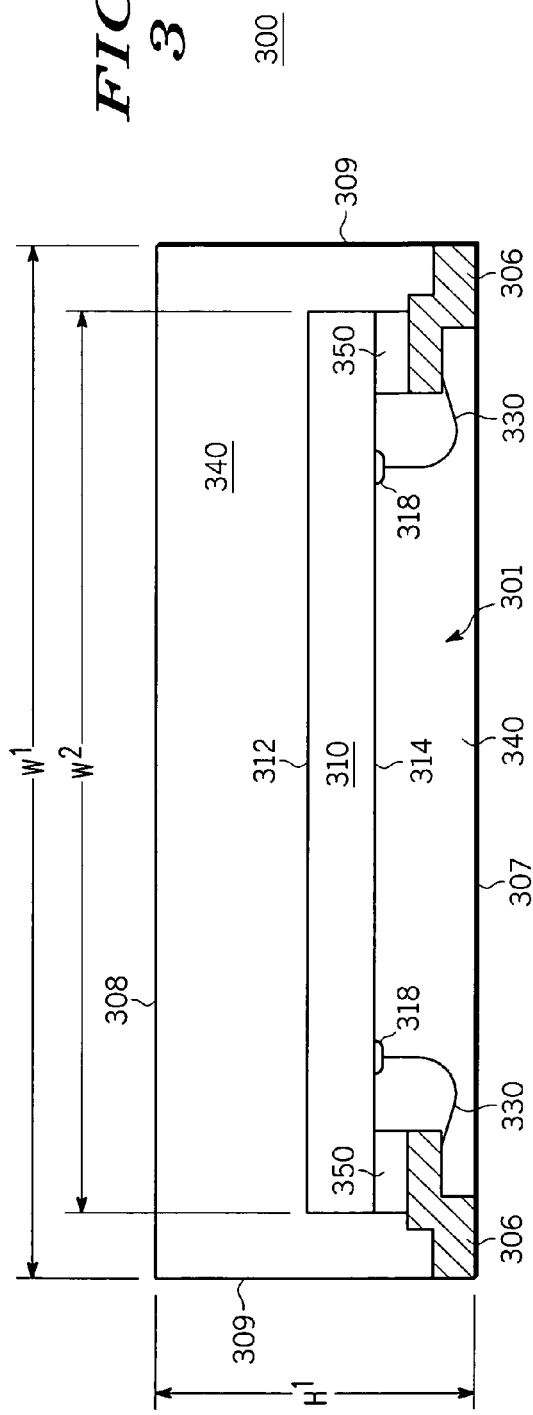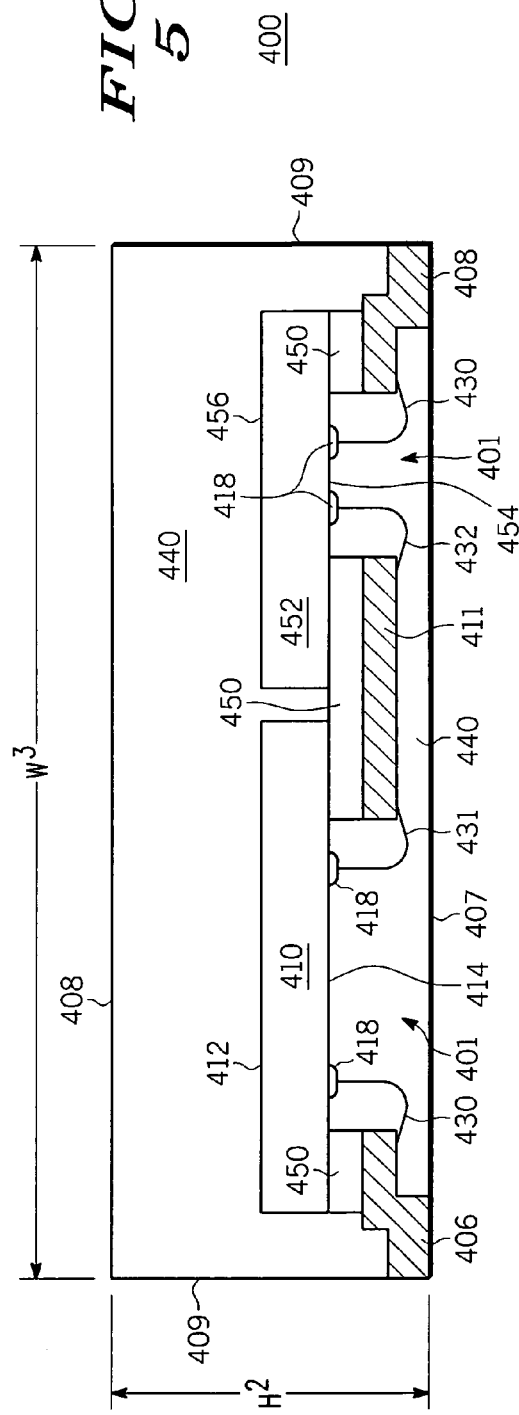

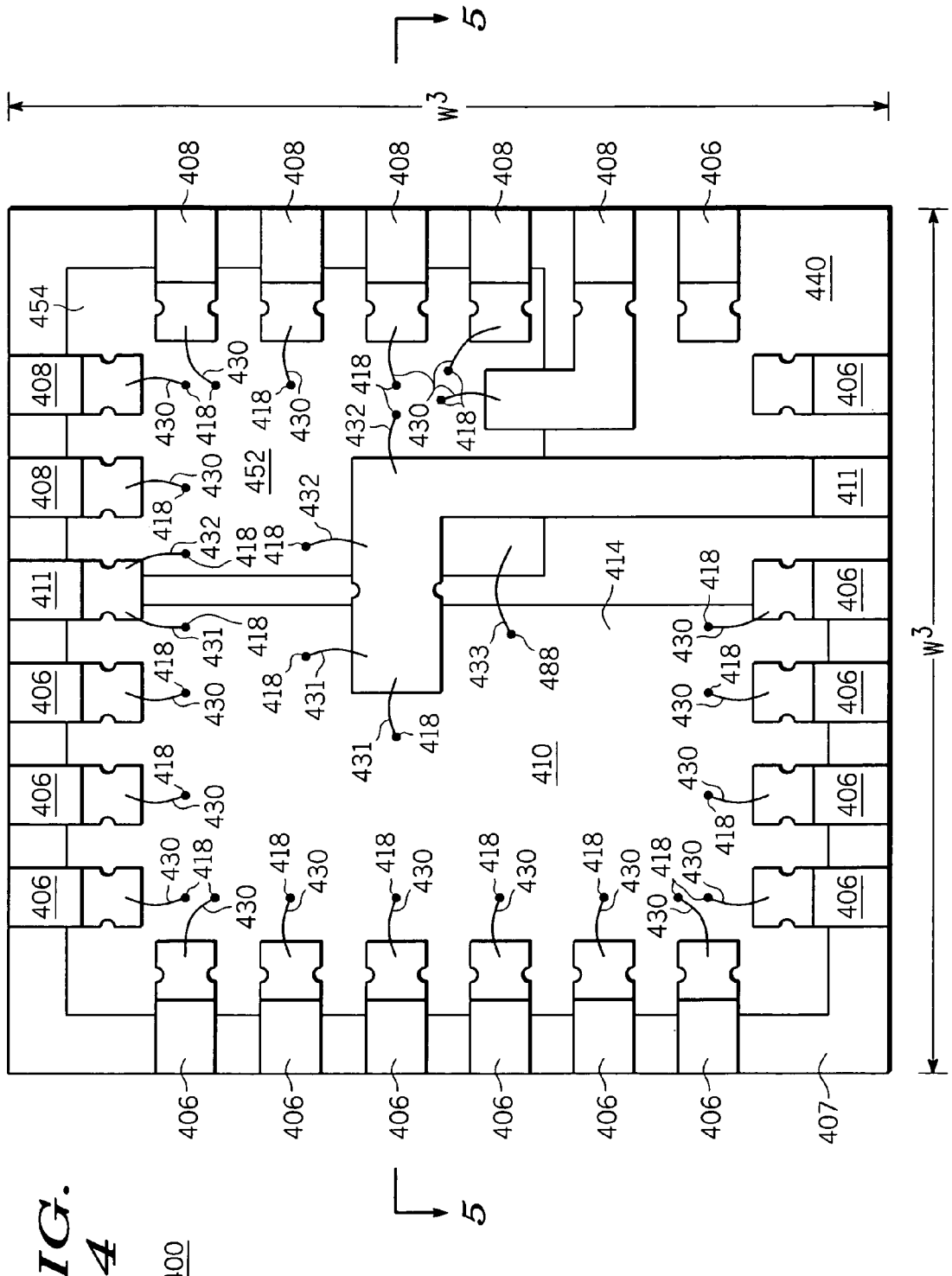

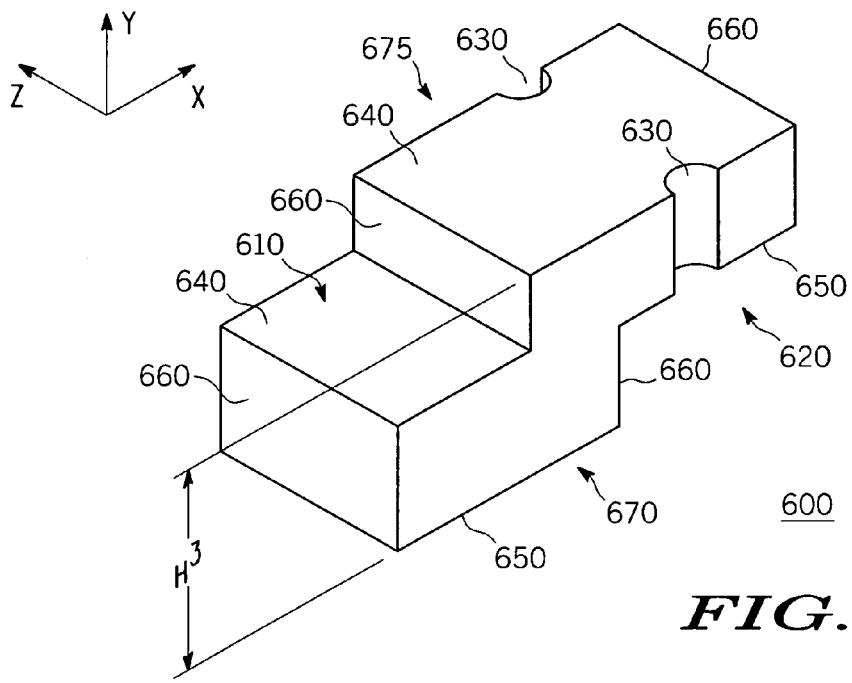
FIG. 6
FIG. 7A
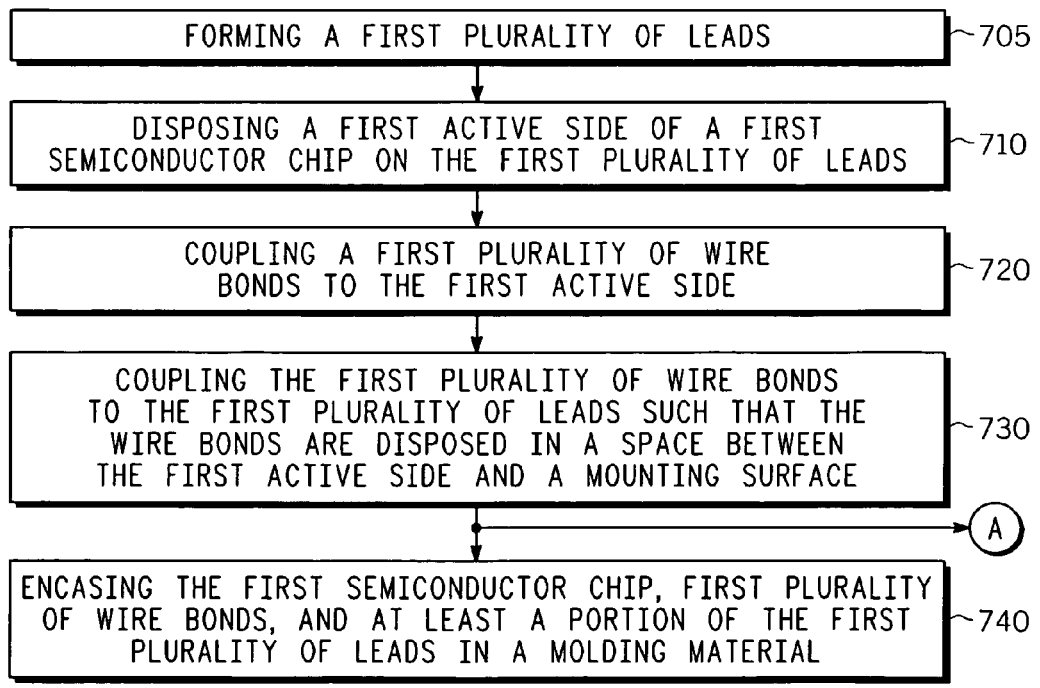

US 7,489,026 B2

METHODS AND APPARATUS FOR A QUAD FLAT NO-LEAD (QFN) PACKAGE

FIELD OF THE INVENTION

The present invention generally relates to electronic packages, and more particularly relates to Quad Flat No-Lead (QFN) packages.

BACKGROUND OF THE INVENTION

Quad Flat No-Lead (QFN) semiconductor packages have achieved wide popularity in recent years because of their smaller package size. QFN packages typically come in a variety of sizes and are often classified according to their size. For example, a QFN package may be referred to as a "4×4" QFN package or a "6×6" QFN package, meaning that the QFN package includes width dimensions of 4 mm by 4 mm, or 6 mm by 6 mm, respectively. Generally, QFN packages are more than 20% larger in area than the semiconductor chip contained with the QFN package, and therefore, are not classified as chip-scale packages.

FIG. 1 is a diagram illustrating a bottom view of a typical QFN package 100. As illustrated, QFN package 100 includes a plurality of leads 105 and a flag 120 exposed on a mounting side 107 formed from a mold material 140 of QFN package 100, wherein leads 105 are typically embedded within mold material 140 so as to be less prone to bending and configured to couple QFN 100 to a printed circuit board (PCB, not shown). Typical leads 105 include a generally rectangular shape such that leads 105 are substantially co-planar with mounting side 107. Moreover, the number of leads 105 included on any particular QFN package 100 varies with the size of QFN package 100. For example, one 4×4 QFN package (i.e., QFN package 100) may include 16 leads (e.g., 4 leads on each side). In addition, flag 120 is typically square-shaped and is utilized for electrical and/or thermal connection between the PCB and a semiconductor chip (discussed below) included within QFN package 100.

FIG. 2 is a diagram illustrating a cross-section view of QFN package 100, wherein QFN package 100 includes a semiconductor chip 110 attached to a flag 120 (or chip pad). Flag 120 is typically formed from a conductive material (e.g., a metal) and includes a mold lock 125 utilized to attach flag 120 to a mold material 140.

Semiconductor chip 110 includes an inactive surface 112, which is utilized to attach semiconductor chip to flag 120 via an adhesive material (e.g., epoxy, tape, solder, or the like, not shown). Furthermore, semiconductor chip 110 includes an active surface 114 having one or more bond pads 118 located at a perimeter 116 of active surface 114, wherein bond pad(s) 118 enable semiconductor chip 120 to be coupled to one or more of leads 105 via one or more wire bonds (discussed below). Semiconductor chip 110 may be formed of, for example, silicon, silicon dioxide, germanium, gallium arsenide, and/or similar material(s), and may be, for example, a complementary metal-oxide semiconductor (CMOS) chip, a micro-electro-mechanical (MEMS) chip, or similar semiconductor chip.

In addition, QFN package 100 includes a plurality of wire bonds 130 for attaching leads 105 to semiconductor chip 110. Wire bonds 130 are typically formed of a conductive material such as, for example, copper, gold, silver, platinum, or similar conductive material. Moreover, wire bonds 130 are usually attached proximate to perimeter 116 of active surface 114 such that each wire bond 130 includes a portion 132 that extends "upwardly" from semiconductor chip 110, a "looped" portion 134, and an inflection point 136 followed with wire that extends "downwardly" with further curvature to wire bond parallel to the surface of lead 105. This wire curvature provides sufficient ball bond strength to both bond pad 118 and to lead 105 and prevents wire bond 130 from coming into contact with semiconductor chip 110 at undesirable points.

Once semiconductor chip 110 is attached to flag 120 and one or more leads 105 via wire bond(s) 130, these components are molded together utilizing mold material 140, wherein mold material 140 forms mounting side 107, a top side 108 oriented substantially opposite mounting side 107, and a plurality of lateral sides 109. Mold material 140 is typically a plastic or similar non-conductive material, and is utilized to protect semiconductor chip 110, flag 120, and wire bonds 130.

As discussed above, because it is desirable that wire bond(s) 130 be attached to lead(s) 105 and semiconductor 110 such that wire bond(s) 130 do not contact semiconductor 110 at undesirable points, a certain minimum width "W" is needed on each side of semiconductor chip 110 and/or a certain height "H" is needed above semiconductor chip 110 to ensure there is sufficient room for wire bond(s) 130 to clear semiconductor 110, but not protrude through top side 108 of mold material 140. Semiconductor chip 110 is typically not perfectly square; nevertheless, the two "Z" widths of semiconductor chip 110 are smaller than the two "Z'" width dimensions of flag 120. Moreover, each lead 105 is separated from flag 120 by a distance "D." The width "W," flag width "Z'", separation spacing "D," and/or height "H" results in QFN package 100 being larger than it otherwise could be.

Various materials having different coefficients of expansion (CTE) may be utilized to construct QFN package 100. When QFN package 100 includes an organic mold material 140 and a metallic flag 120 structure having a semiconductor chip "sandwiched" in-between them (discussed below), QFN package 100 will generally create bending forces similar to bimetallic strips during subsequent exposure to heating and cooling conditions. As a result, QFN package 100 will typically contain inherent residual stress that can warp or bend QFN package 100, which can lead to package failure (e.g., delamination between mold material 140 and leads 105).

To reduce the amount of residual stress, flag 120 and/or leads 105 include mold locks 125 to increase adhesion between mold material 140 and metal flag 120 and/or between mold material 140 and leads 105. In other words, mold locks 125 help to minimize package delamination caused by residual bending forces.

BRIEF DESCRIPTION OF THE DRAWINGS

The present invention will hereinafter be described in conjunction with the following drawing figures, wherein like numerals denote like elements.

FIG. 3 is a diagram illustrating a cross-sectional view of one embodiment of a QFN package having at least one smaller dimension than the QFN package of FIGS. 1 and 2 for a given semiconductor chip size;

FIG. 4 is a diagram illustrating a bottom view an embodiment of a QFN package including a plurality of semiconductor chips;

FIG. 5 is a diagram illustrating a cross-section view of the QFN package of FIG. 4 along line 5-5;

FIG. 6 is a diagram illustrating one embodiment of a lead having mold lock features included on the QFN packages of FIGS. 3 and 4; and FIGS. 7A and 7B are a flow diagram illustrating a representation of one embodiment of a method of making the QFN packages of FIGS. 3 and 4.

DETAILED DESCRIPTION OF THE INVENTION

Figure 1:
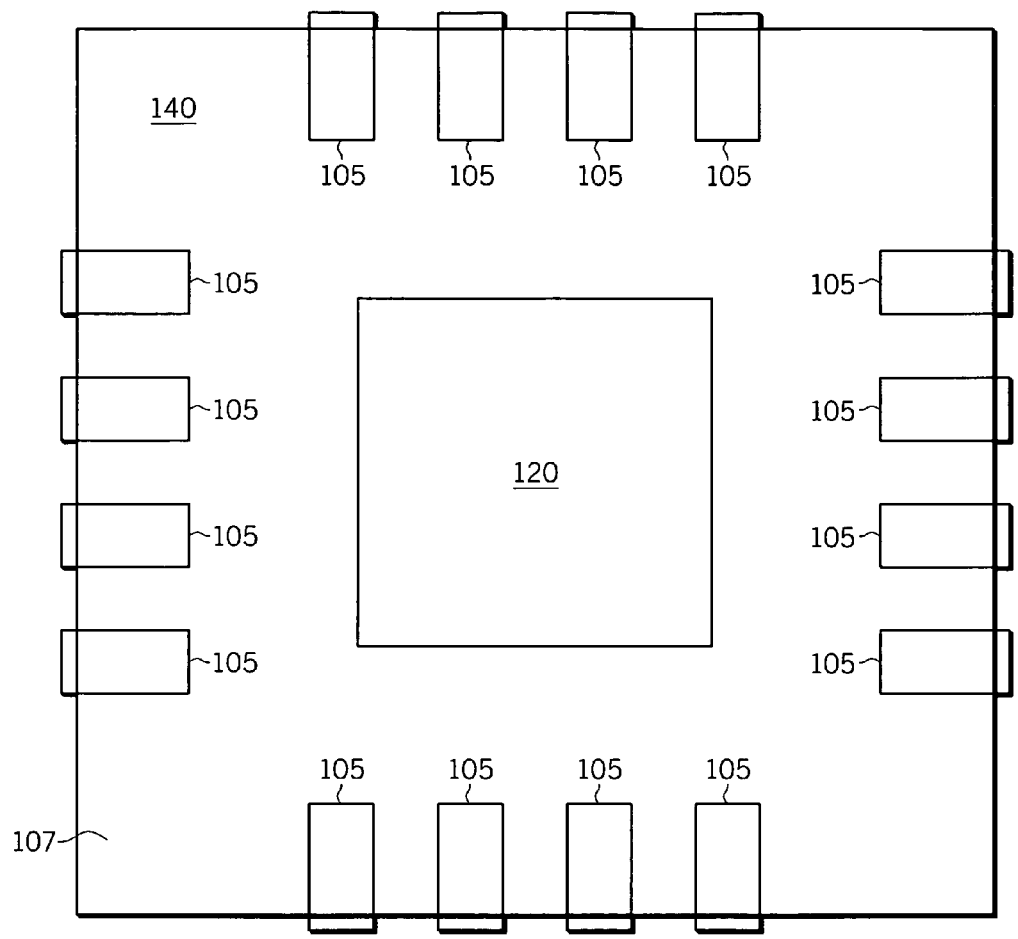
FIG. 1 is a diagram illustrating a bottom view of a prior art Quad Flat No-Lead (QFN) package.

The following detailed description of the invention is merely exemplary in nature and is not intended to limit the invention or the application and uses of the invention. Furthermore, there is no intention to be bound by any theory presented in the preceding background of the invention or the following detailed description of the invention.

As is known in the art, it is desirable that QFN packages be smaller (preferably in all three dimensions for any given chip size) than their current size so that QFN packages do not take up as much space on, for example, a PCB. Accordingly, it is desirable to provide a QFN package that is smaller than current QFN packages to become a chip-scaled QFN package (i.e., a QFN package including widths that are slightly larger than the semiconductor chip dimensions). In addition, it is desirable to provide a smaller QFN package having multiple semiconductor chips so that a multi-chipped QFN package takes up less space than current multi-chipped QFN packages. Further, for superior package reliability, it is desirable to include a QFN package having larger mold lock features to prevent mold material delamination from QFN package leads. Moreover, it is desirable to decrease package bending stress resulting from different materials acting on the semiconductor chip by including the same mold material on all sides of the semiconductor chip.

FIG. 3 is a diagram illustrating a cross-sectional view of one embodiment of a Quad Flat No-Lead (QFN) package 300. As illustrated in FIG. 3, QFN package includes a mounting side 307, a top side 308, and a plurality of lateral sides 309 similar to mounting side 107, top side 108, and lateral sides 109 discussed above, respectively. Notably, mounting side 307 does not include a flag (e.g., flag 120), as required by QFN package 100.

QFN package 300 includes a plurality of leads 306 exposed through mounting side 307. In addition, QFN package 300 includes a semiconductor chip 310 including an inactive side 312 and an active side 314 similar to semiconductor chip 110 discussed above. Semiconductor chip 310, in one embodiment, includes a width "$W^1$" no greater than about 2.1 mm In one embodiment, a center (not shown) of semiconductor chip 310 is oriented in the three-dimensional center (with respect to an X axis, Y axis, and Z axis) of QFN package 300. For example, if QFN package 300 is a 5 mm×5 mm QFN package (with a height of 0.7 mm), the center of semiconductor chip 310 would be located substantially at point (2.5 mm, 2.5 mm, 0.4 mm). In another embodiment, the center of semiconductor chip 310 is oriented in the two-dimensional center (with respect to the X axis and Y axis of the width) of mounting side 307. For example, if QFN package 300 is a 5 mm×5 mm QFN package, the center of semiconductor chip 310 would be located substantially at point (2.5 mm, 2.5 mm) with respect to the widths of mounting side 307.

Figure 2:
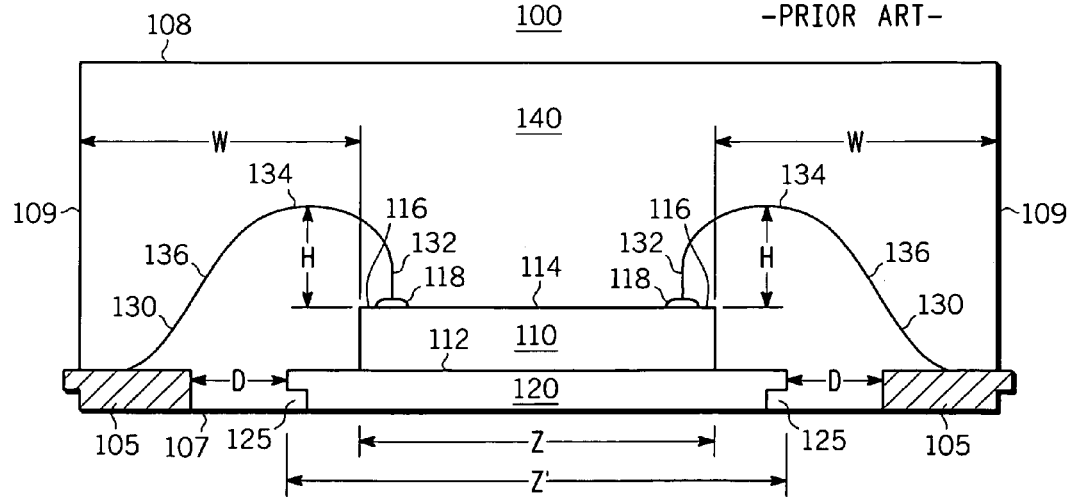
FIG. 2 is a diagram illustrating a cross-section view of the QFN package of FIG. 1.

In accordance with one embodiment, active side 314 is disposed on leads 306 via an adhesive material 350, wherein examples of adhesive material 350 include, but are not limited to, epoxy, tape, or similar adhesive materials. For example, a thermally conductive adhesive material may be utilized to enhance heat dissipation from active side 314 through leads 306. Active side 314 is oriented toward or faces mounting side 307 (as opposed to active side 114 being oriented toward or facing top side 108, as discussed above with reference to FIG. 2). In addition, one or more bond pads 318 on active side 314 are located more toward the center of semiconductor chip 310 to avoid interference from adhesive material 350 and to allow wirebonding of the bond pads 318 to leads 306. Furthermore, leads 306 include a shape (discussed below) such that a space (or gap) 301 is created between active side 314 and mounting side 307.

In addition, QFN package 300 includes wire bonds 330 similar to wire bonds 130 discussed above, wherein wire bonds 330 couple active side 314 to leads 306. In accordance with one embodiment, in coupling active side 314 to leads 306, wire bonds 330 are disposed substantially within space 301 (i.e., are disposed between active side 314 and mounting side 307). In this manner, QFN package 300 is able to have a reduced size compared to current QFN packages (e.g., QFN package 100). In other words, QFN package 300 is able to reduce the size of the width "$W^1$" and/or the height "$H^1$," as compared to QFN package 100.

Moreover, because QFN package 300 includes lead-to-active surface elevation (i.e., active side 314 is "higher" than leads 306), QFN package 300 is well-suited for the industry standard gold wire ball bonding. In one embodiment, wire bonds 330 are longer wedge bond wires including an inflection point in the wire curvature. In another embodiment, wire bonds 330 are shorter ball bonds having a portion extending downward from surface 314 similar to portion 132 discussed with reference to FIG. 2; a loop portion similar to portion 134 discussed with reference to FIG. 2, but no inflection point and fewer bends during the wire bonds process to minimize electrical resistance and cost.

In accordance with one embodiment, QFN package 300 includes a width $W^1$ no greater than about 2.5 mm. In another embodiment, QFN package 300 includes a height $H^1$ no greater than about 1.0 mm. In yet another embodiment, QFN package 300 includes a width $W^1$ of about 2.0 mm and a height $H^1$ of about 0.8 mm.

QFN package 300, in accordance with one exemplary embodiment, includes a ratio of $W^1/W^2$ no greater than about 1.2 such that QFN package 300 is a chip-scale package. In other embodiments, the ratio of $W^1/W^2$ may be greater than 1.2 such that QFN package 300 is not a chip-scale package.

Furthermore, various embodiments of QFN package 300 contemplate having smaller and/or thinner dimensions than those discussed above should die dimensions decrease and/or lead dimensions decrease. Moreover, various embodiments of QFN package 300 contemplate having larger and/or thicker dimensions than those discussed above.

FIG. 4 is a diagram illustrating a bottom view of an embodiment of a QFN package 400 including a plurality of semiconductor chips, wherein the bottom view excludes a molding material 440 (similar to molding material 140) forming a mounting side 407, although QFN package 400 includes molding material 440 forming mounting side 407. As illustrated, QFN package 400 includes a semiconductor chip 410 and a semiconductor chip 452, wherein each of semiconductor chips 410 and 452 are similar to semiconductor chip 310 discussed above. In accordance with one exemplary embodiment, semiconductor chips 410 and 452 are substantially the same type of semiconductor chip (e.g., MEMS or CMOS chips). In another embodiment, semiconductor chips 410 and 452 are different types of semiconductor chips (e.g., semiconductor chip 410 is a SiGe chip and semiconductor chip 452 is a CMOS chip).

In addition, QFN package 400 includes a plurality of leads 406 coupled to semiconductor chip 410 and a plurality of leads 408 coupled to semiconductor chip 452 via a plurality of wire bonds 430, wherein leads 406 and 408 are similar to leads 306 and wire bonds 430 are similar to wire bonds 330 discussed above. Furthermore, QFN package 400 includes at least one lead 411 coupled to both semiconductor chip 410 and semiconductor chip 452. Moreover, lead 411 is coupled to each of semiconductor chips 410 and 452 via a plurality wire bonds 430 (e.g., a first wire bond 431 coupling lead 411 to semiconductor chip 410 via a bond pad 418 and a second wire bond 432 coupling lead 411 to semiconductor chip 452 via a bond pad 418).

QFN package 400, in another embodiment, includes at least one wire bond 433 similar to wire bonds 330 coupling semiconductor chip 410 to semiconductor chip 452. As illustrated, at least one of semiconductor chips 410 and 452 includes a stud 488 formed of, for example, gold utilized for "direct" coupling of semiconductor chips 410 and 452 to one another via wire bond 433. Here, wire bond(s) 433 provide more chip-to-chip connection paths between semiconductor chips 410 and 452 than, for example, lead(s) 411.

In accordance with one embodiment, QFN package 400 includes one wire bond 433 and/or one lead 411 coupling semiconductor chip 410 to semiconductor chip 452. In another embodiment, QFN package 400 includes more than one wire bond 433 and/or more than one lead 411 coupling semiconductor chip 410 to semiconductor chip 452.

Notably, FIG. 4 illustrates QFN package 400 including two leads 411; however, QFN package 400 may include any number of leads 411, including zero. Furthermore, FIG. 4 illustrates each of leads 411 including a single wire bond 431 coupling each of leads 411 to semiconductor chip 410 and a single wire bond 432 coupling each of leads 411 to semiconductor chip 452; however, lead 411 may include any number of wire bonds 431 and/or wire bonds 432 coupling lead 411 to semiconductor chips 410 and 452, respectively, including zero wire bonds 431 or zero wire bonds 432. Moreover, QFN package 400 is illustrated as including a single wire bond 433; however, QFN package 400 may include any number of wire bonds 433 coupling semiconductor chip 410 to semiconductor chip 452, including zero.

FIG. 5 is a diagram illustrating a cross-section view of QFN package 400 taken along line 5-5. As illustrated, QFN package 400 includes semiconductor chips 410 and 452 including active sides 414 and 454 (and inactive sides 412 and 456, respectively), respectively, disposed on leads 406, 408, and 411 via an adhesive material 450 similar to adhesive material 350 discuss above.

In one embodiment, QFN package 400 includes wire bonds 430, 431, and 432 coupling leads 406, 408, and 411 to semiconductor chips 410 and/or 452 (via bond pads 418). Moreover, wire bonds 430, 431, and/or 432 are disposed within a space 401 created between active surface 414 and/or active surface 454 of semiconductor chips 410 and/or 452 and mounting surface 407. In other words, a portion or all of wire bonds 430, 431, and/or 432 are disposed between active surfaces 414 and/or 454 of semiconductor chips 410 and/or 452, respectively, and mounting surface 407.

Similar to QFN package 300, QFN package 400 includes molding material 440 encasing semiconductor chips 410 and 452, wire bonds 430, 431, and/or 432, and at least partially encasing leads 406, 408, and/or 411. Moreover, molding material 440 forms mounting side 407, top side 408, and lateral sides 409 similar to various embodiments discussed above.

In accordance with one embodiment, QFN package 400 includes a width "$W^3$" no greater than about 5.5 mm. In another embodiment, QFN package 400 includes a height "$H^2$" no greater than about 1.0 mm. In yet another embodiment, QFN package 400 includes a width "$W^3$" of about 5.0 mm and a height "$H^2$" of about 0.8 mm. Moreover, other embodiments of QFN package 400 may include other widths no greater than about 1.0 mm and/or other heights no greater than about 5.5 mm.

Notably, various embodiments of QFN package 400 contemplate that QFN package 400 may include more than two semiconductor chips. Moreover, QFN package 400 may also include dimensions greater than those discussed above.

FIG. 6 is a diagram of a side view of a lead 600 (e.g., lead 306, 406, or 408) in accordance with one embodiment of QFN package 300 and QFN package 400. As illustrated, lead 600 includes mold locks 610, 620, and 630. Mold locks 610, 620, and 630 are configured on lead 600 such that, when coupled to molding material 340 or 440, lead 600 is substantially unable to delaminate from mold material 340, 440 and move without cracking mold material 340, 440. In other words, mold locks 610, 620, and 630 substantially prevent lead 600 from moving in a direction along the X-axis, Y-axis, or Z-axis.

Mold locks 610 and 630 both substantially lock mold material 340, 440 from moving to the right relative to lead 600. In one embodiment, mold lock 610 is substantially larger than mold lock 630 such that mold lock 610 provides a superior locking feature than mold lock 630. Mold lock 620 locks mold material 340, 440 from moving both up and to the left relative to lead 600.

Lead 600, in one embodiment, includes a "jogged-shape" such that lead 600 is surrounded by molding material 340 or 440 on three axes. In other words, molding material 340 or 440 will substantially fill the space above surfaces 640, at least a portion of the space below two-tiered surface 650, the space beside surfaces 660, and the side spaces 675 of surfaces 670. In addition, various embodiments contemplate that lead 600 may include any shape that will create a space (e.g., space 301 and space 401) which enables wire bonds 330, 430, 431, and 432 to be disposed within such space (i.e., disposed between active side 314, 414, and/or 454 and mounting side 307 or 407).

In accordance with one embodiment, the height "$H^3$" of lead 600 is in the range of about 0.15 mm to about 0.40 mm. In another embodiment, the height $H^3$ is less than about 0.40 mm.

Lead 600 is formed of a conductive material including, for example, a metal, an alloy, or other similar conductive material. In accordance with one embodiment, lead 600 is formed of copper. In another embodiment, lead 600 is formed of copper that has been electroplated with nickel, a nickel-palladium film, a nickel-gold film, chromium, or a chromium film.

Figure 7B:
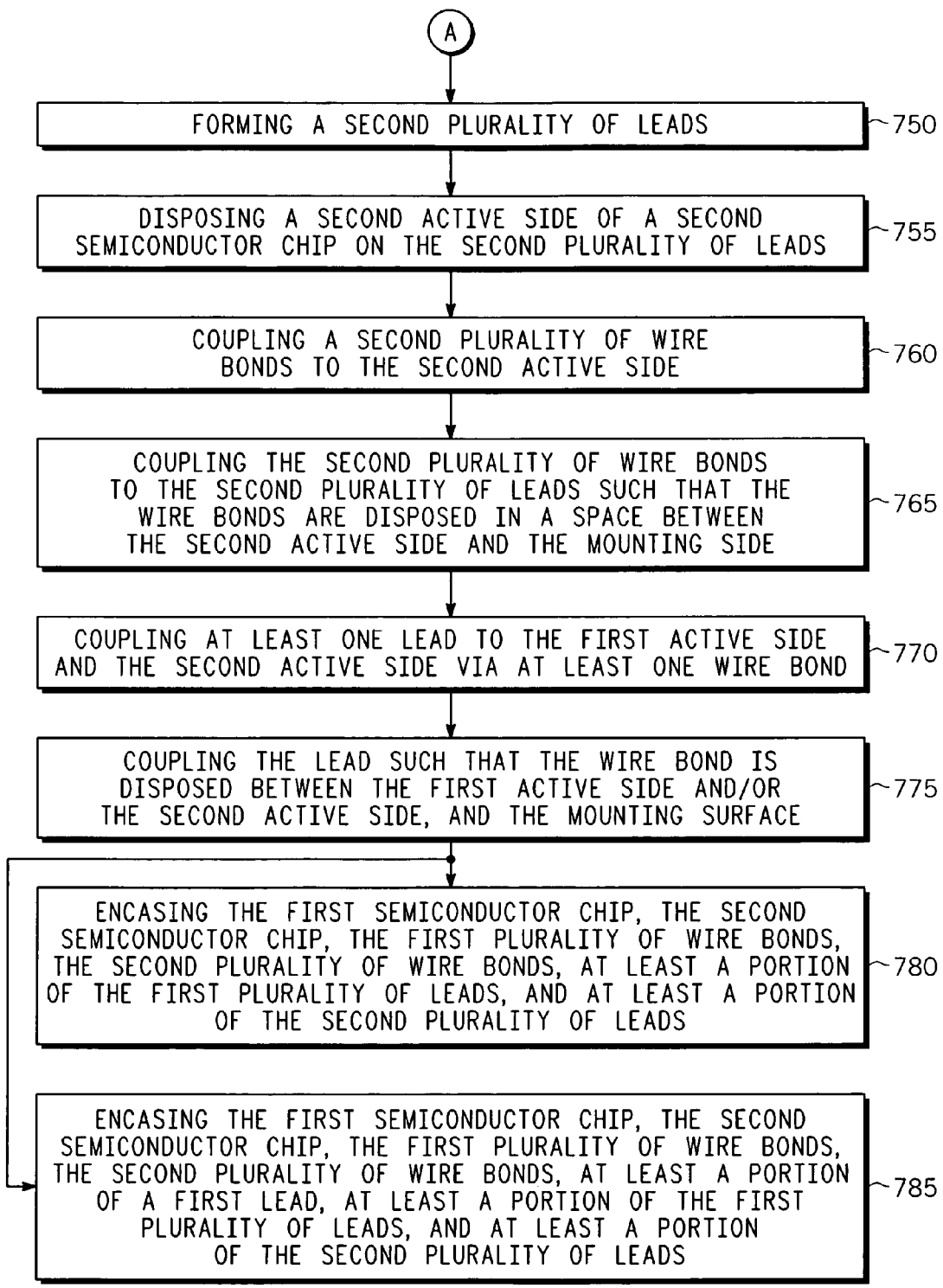

FIGS. 7A and 7B illustrate a flow diagram representing one embodiment of a method 700 of forming a QFN package (e.g., QFN package 300 and QFN package 400) having a reduced size. In accordance with one embodiment, method 700 initiates by forming a first plurality of leads (e.g., leads 306 and leads 406) (block 705). Block 705, in accordance with one embodiment, includes forming at least one mold lock (e.g., mold locks 610, 620, and/or 630) in at least one lead such that the lead is substantially unable to move in a direction along an X-axis, a Y-axis, or a Z-axis. In another embodiment, block 705 includes forming at least two mold locks in at least one lead such that the lead is substantially unable to move in a direction along an X-axis and a Y-axis, an X-axis and a Z-axis, or a Y-axis and a Z-axis. In yet another embodiment, block 705 includes forming at least three mold locks in at least one lead such that the lead is substantially unable to move in a direction along an X-axis, a Y-axis, and a Z-axis.

Furthermore, method 700 includes disposing or adhering a first active side (e.g., active side 314 and active side 414) of a first semiconductor chip (e.g., semiconductor chip 310 and semiconductor chip 410) on the first plurality of leads (block 710). In addition, method 700 includes coupling a first plurality of wire bonds (e.g., wire bonds 330 and wire bonds 430) to the first active side (block 720). Furthermore, method 700 includes coupling the first plurality of wire bonds to the first plurality of leads such that the first plurality of wire bonds are disposed within a space (e.g., space 301 and space 401) between the active side and a mounting side (e.g., mounting side 307 and mounting side 407) of the QFN package (block 730). Moreover, method 700 includes encasing the first semiconductor chip, the first plurality of wire bonds, and at least a portion of the first plurality of leads in a molding material (e.g., mold material 340) (block 740).

In accordance with another embodiment, method 700 includes forming a second plurality of leads (e.g., leads 306 and leads 406) (block 750). Block 750, in accordance with one embodiment, includes forming at least one mold lock (e.g., mold locks 610, 620, and/or 630) in at least one lead such that the lead is substantially unable to move in a direction along an X-axis, a Y-axis, or a Z-axis. In another embodiment, block 750 includes forming at least two mold locks in at least one lead such that the lead is substantially unable to move in a direction along an X-axis and a Y-axis, an X-axis and a Z-axis, or a Y-axis and a Z-axis. In yet another embodiment, block 750 includes forming at least three mold locks in at least one lead such that the lead is substantially unable to move in a direction along an X-axis, a Y-axis, and a Z-axis.

Furthermore, method 700 includes disposing or adhering a second active side (e.g., active side 454) of a second semiconductor chip (e.g., semiconductor chip 452) on a second plurality of leads (e.g., leads 408 and/or 411) (block 755). In addition, method 700 includes coupling a second plurality of wire bonds (e.g., wire bonds 431) to the second active side (block 760). Furthermore, method 700 includes coupling the second plurality of wire bonds to the second plurality of leads such that the second plurality of wire bonds are disposed within the space (e.g., space 401) between the second active side and the mounting side (e.g., mounting side 407) of the QFN package (block 765).

Method 700, in one embodiment, includes coupling at least one lead (e.g., lead 408) to the first active side and to the second active side via at least one wire bond (e.g., wire bond 432) (block 770). Furthermore, method 700 includes coupling the at least one wire bond such that the wire bond is disposed between the first active side and/or the second active side, and the mounting side (block 775).

In accordance with one embodiment, method 700 includes encasing the first semiconductor chip, the second semiconductor chip, the first plurality of wire bonds, the second plurality of wire bonds, at least a portion of the first plurality of leads, and at least a portion of the second plurality of leads in a molding material (e.g., mold material 440) (block 780). In accordance with another embodiment, method 700 includes encasing the first semiconductor chip, the second semiconductor chip, the first plurality of wire bonds, the second plurality of wire bonds, at least a portion of a first lead (i.e., lead 408), at least a portion of the first plurality of leads, and at least a portion of the second plurality of leads in a molding material (e.g., mold material 440) (block 785).

Notably, although method 700 has been discussed in a particular order, method 700 is not required to be performed in the order presented. Moreover, various embodiments of method 700 may omit one or more of the steps discussed above with respect to blocks 705 through 785.

In summary, various embodiments provide a Quad Flat No-Lead (QFN) package having a mounting side, the chip-scale package comprising a semiconductor chip including an active surface and a inactive surface, a plurality of leads exposed on the mounting side, and a plurality of wire bonds configured to couple the plurality of leads to the semiconductor chip, wherein the active surface is oriented toward the mounting side and the plurality of wire bonds are disposed between the active surface and the mounting side. In one embodiment, the plurality of leads comprises at least one mold lock coupling each of the plurality of leads to a mold material.

The QFN package, in one embodiment, further comprises a mold material substantially surrounding the semiconductor chip and the wire bonds, and at least partially surrounding the plurality of leads, wherein each of the plurality of leads comprises a jogged-shape to couple each of the plurality of leads to the mold material. In another embodiment, the QFN package further comprises a top side located substantially opposite the mounting side and a plurality of lateral sides, wherein a first center of the semiconductor chip is oriented substantially in a second center of the chip-scale package, and the second center is located at a center of the mounting side, the top side, and the plurality of sides.

In another embodiment, the QFN package the mounting side includes a width that is not greater than about 2.5 mm. Furthermore, a height of the chip-scale package is not greater than about 1 mm. Moreover, a ratio of a width of the QFN package to a width of the semiconductor chip is no greater than 1.2. The QFN package, in yet another embodiment, includes at least one of the plurality of leads having a jogged shape including a two-tiered surface oriented toward the mounting side, and wherein at least one wire bond is coupled to the active side and the two-tiered surface.

Other embodiments provide a QFN package having a mounting side, the QFN package comprising a first semiconductor chip including a first active surface and a first inactive surface, a second semiconductor chip including a second active surface and a second inactive surface, a first plurality of leads oriented on the mounting side, and a first plurality of wire bonds coupling the first plurality of leads to the first semiconductor chip, wherein the first active surface is oriented toward the mounting side, and the first plurality of wire bonds are disposed between the first active surface and the mounting side. In one embodiment, the QFN package further comprises a second plurality of leads oriented on the mounting side, and a second plurality of wire bonds coupling the second plurality of leads to the second semiconductor chip, wherein the second plurality of wire bonds are disposed between the second active surface and the mounting side.

In another embodiment, the QFN package comprises a first wire bond coupling a first lead to the first active side, wherein the first wire bond is disposed between the first active surface and the mounting side. In yet another embodiment, the QFN package comprises a second wire bond coupling the first lead to the second active side, wherein the second wire bond is disposed between the second active surface and the mounting side.

In yet another embodiment, the first plurality of leads and second plurality of leads each comprise at least one mold lock coupling each of the first plurality of leads and the second plurality of leads to the mold material. In still another embodiment, each of the first plurality of leads and/or the second plurality of leads comprise a jogged-shape to couple each of the first plurality of leads and the second plurality of leads to the mold material.

Alternatively, the mounting side includes a width that is not greater than about 5 mm. In another embodiment, QFN package includes a height not greater than about 1 mm.

Various other embodiments provide a method of forming a QFN package having a mounting side, the method comprising disposing a first active side of a first semiconductor chip on a first plurality of leads, the first plurality of leads oriented on the mounting side and at least a portion of one of the first plurality of leads is exposed on the mounting side; coupling a first plurality of wire bonds to the first active side of the first semiconductor chip; and coupling the first plurality of wire bonds to the first plurality of leads, wherein the first plurality of wire bonds are oriented between the first active side and the mounting side. In one embodiment, the method further comprises encasing the semiconductor chip, at least a portion of each of the plurality of leads, and the plurality of wire bonds in a mold material. Furthermore, the method further comprises forming at least one mold lock on each of the plurality of leads to couple the plurality of leads to the mold material.

In another embodiment, the method further comprises disposing a second active side of a second semiconductor chip on a second plurality of leads, the second plurality of leads oriented on the mounting side and at least a portion of one of the second plurality of leads is exposed on the mounting side; coupling a second plurality of wire bonds to the second active side of the second semiconductor chip; and coupling the second plurality of wire bonds to the second plurality of leads, wherein the second plurality of wire bonds are oriented between the second active side and the mounting side. In a further embodiment, the method of comprises coupling at least a first lead to the first active surface and the second active surface. In one embodiment, coupling the first wire bond comprises coupling a first wire bond to the first lead and the first active surface such that the first wire bond is disposed between the first active side and the mounting side, and coupling a second wire bond to the first lead and the second active surface such that the second wire bond is disposed between the second active side and the mounting side.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

We claim:

1. A Quad Flat No-Lead (QFN) package, the QFN package comprising:
    a mold material defining the QFN package including a mounting side having a perimeter;
    a semiconductor chip including an active surface and an inactive surface housed within the mold material;
    a plurality of leads exposed on the mounting side and partially housed within the mold material, the plurality of leads included within the perimeter of the mold material; and
    a plurality of wire bonds configured to couple the plurality of leads to the semiconductor chip, wherein the active surface is oriented toward the mounting side and the plurality of wire bonds are disposed between the active surface and the mounting side within the mold material.

2. The QFN package of claim 1, wherein the plurality of leads comprises at least one mold lock coupling each of the plurality of leads to the mold material.

3. The QFN package of claim 1, wherein each of the plurality of leads comprises a jogged-shape to couple each of the plurality of leads to the mold material.

4. The QFN package of claim 1, further comprising a top side located substantially opposite the mounting side and a plurality of lateral sides, wherein:
    a first center of the semiconductor chip is oriented substantially in a second center of the QFN package, and
    the second center is located at a center of the mounting side, the top side, and the plurality of sides.

5. The QFN package of claim 1, wherein a width of the mounting side is not greater than about 2.5 mm.

6. The QFN package of claim 5, wherein a height of the QFN package is not greater than about 1 mm.

7. The QFN package of claim 1, wherein a ratio of a width of the QFN package to a width of the semiconductor chip is no greater than 1.2.

8. The QFN package of claim 1, wherein at least one of the plurality of leads includes a jogged shape having a two-tiered surface oriented toward the mounting side, and wherein at least one wire bond is coupled to the active side and the two-tiered surface.

9. A QFN package having a mounting side, the QFN package comprising:
    a first semiconductor chip including a first active surface and a first inactive surface;
    a second semiconductor chip including a second active surface and a second inactive surface;
    a first plurality of leads oriented on the mounting side; and
    a first plurality of wire bonds coupling the first plurality of leads to the first semiconductor chip, wherein:
        the first active surface is oriented toward the mounting side, and
        the first plurality of wire bonds are disposed between the first active surface and the mounting side.

10. The QFN package of claim 9, further comprising:
    a second plurality of leads oriented on the mounting side; and
    a second plurality of wire bonds coupling the second plurality of leads to the second semiconductor chip, wherein the second plurality of wire bonds are disposed between the second active surface and the mounting side.

11. The QFN package of claim 10, further comprising:
    a first wire bond coupling a first lead to the first active side, wherein the first wire bond is disposed between the first active surface and the mounting side.

12. The QFN package of claim 11, further comprising:
    a second wire bond coupling the first lead to the second active side, wherein the second wire bond is disposed between the second active surface and the mounting side.

13. The QFN package of claim 10, wherein the first plurality of leads and second plurality of leads each comprise at least one mold lock coupling each of the first plurality of leads and the second plurality of leads to the mold material.

14. The QFN package of claim 10, wherein each of the first plurality of leads and the second plurality of leads comprise a jogged-shape to couple each of the first plurality of leads and the second plurality of leads to the mold material.

15. The QFN package of claim 9, wherein a width of the mounting side is not greater than about 5.5 mm.

16. The QFN package of claim 9, wherein the QFN package includes a height not greater than about 1 mm.

17. The QFN package of claim 15, wherein the width of the mounting side is 5 mm.

18. The QFN package of claim 17, wherein the QFN package includes a height of about 0.8 mm.

19. The QFN package of claim 9, wherein the first plurality of leads each include a height in the range of about 0.15 mm to about 0.4 mm.

20. The QFN package of claim 1, wherein the plurality of leads each include a height in the range of about 0.15 mm to about 0.4 mm.

21. A QFN package having a mounting side, the QFN package comprising:
 a first semiconductor chip including a first active surface oriented toward the mounting side;
 a second semiconductor chip including a second active surface oriented toward the mounting side;
 a lead oriented on the mounting side;
 a first wire bond coupling the lead to the first active surface; and
 a second wire bond coupling the lead to the second active surface.

22. The QFN package of claim 21, wherein the first wire bond is disposed between the first active surface and the mounting side, and the second wire bond is disposed between the second active surface and the mounting side.

23. The QFN package of claim 21, wherein a width of the mounting side is not greater than about 5.5 mm.

\* \* \* \* \*